United States Patent [19]
Wördenweber et al.

[11] Patent Number: 5,476,838
[45] Date of Patent: Dec. 19, 1995

[54] PROCESS FOR PRODUCING THIN LAYERS BY MEANS OF REACTIVE CATHODE SPUTTERING AND APPARATUS FOR IMPLEMENTING THE PROCESS

[75] Inventors: Roger Wördenweber, Niederzier; Ursus Krüger, Köln; Rolf Kutzner, Jülich, all of Germany

[73] Assignee: Forschungszentrum Julich, Julich, Germany

[21] Appl. No.: 133,175

[22] PCT Filed: Feb. 13, 1993

[86] PCT No.: PCT/DE93/00125

§ 371 Date: Oct. 14, 1993

§ 102(e) Date: Oct. 14, 1993

[87] PCT Pub. No.: WO93/16211

PCT Pub. Date: Aug. 19, 1993

[30] Foreign Application Priority Data

Feb. 14, 1992 [DE] Germany ........................ 42 04 371.9
Aug. 22, 1992 [DE] Germany ........................ 42 27 961.5

[51] Int. Cl.⁶ .................. H01L 39/24; C23C 14/54
[52] U.S. Cl. .............. 505/475; 204/192.13; 204/192.24; 204/298.03; 204/298.06; 204/298.07; 505/476; 505/731; 505/816
[58] Field of Search ................ 204/192.13, 192.24, 204/298.03, 298.06, 298.07; 505/475–476, 816, 731

[56] References Cited

U.S. PATENT DOCUMENTS

| 4,407,709 | 10/1983 | Enjouji et al. | 204/192.13 |
| 4,704,199 | 11/1987 | Yokokawa et al. | 204/298.03 |
| 4,894,132 | 1/1990 | Tanaka | 204/192.13 |
| 4,895,631 | 1/1990 | Wirz et al. | 204/192.13 |

FOREIGN PATENT DOCUMENTS

| 0282835 | 9/1988 | European Pat. Off. | 204/298.03 |
| 2232832 | 1/1975 | France | 204/192.13 |
| 2503190 | 10/1982 | France | |
| 3730834 | 4/1988 | Germany | 204/298.03 |

Primary Examiner—Aaron Weisstuch
Attorney, Agent, or Firm—Herbert Dubno; Jonathan Myers

[57] ABSTRACT

The invention relates to a process for producing thin films in which the pressure of the process gas is kept constant in a process chamber with a gas inlet and outlet, a target and a substrate, while material is sputtered from the target and deposited on the substrate. The invention also relates to a process for producing thin films. It is the purpose of the invention to create a process providing a more homogenous film. According to the invention, to this end the process gas is caused to reach the plasma. Alternatively, either one or several emission lines may be spectroscopically detected in a spatial region and, after a desired cross sectional shape has been set, it is kept constant in time by subsequently regulating the process gas mixing ratio. It is also possible to attain the set aim by arranging a probe in such a way that charged atoms of the process gas are detected and, to attain the desired homogeneity, the voltage at the probe is constantly regulated by subsequently adjusting the process gas mixing ratio.

29 Claims, 3 Drawing Sheets

PROCESS FOR PRODUCING THIN LAYERS BY MEANS OF REACTIVE CATHODE SPUTTERING AND APPARATUS FOR IMPLEMENTING THE PROCESS

FIELD OF THE INVENTION

The invention relates to a process for producing thin layers by means of reactive cathode sputtering using a process chamber with gas inlet and a gas outlet, a process gas as a gas mixture, at least one target formed as a cathode and a substrate, and for control the pressure of the process gas is held constant while material is sputtered from the target and deposited on the substrate. The invention also relates to an apparatus for producing thin layers with the aid of a chamber suitable for reactive cathodic sputtering with a gas inlet and a gas outlet for the purpose of control of a process gas provided as a mixture.

BACKGROUND OF THE INVENTION

Following the discovery of the oxidic high temperature superconductors in the year 1986, efforts have been made to include this material in microelectronics. The oxidic high temperature superconductors are materials with a complex structure. In order to ensure production of the highest quality and, where possible, epitaxially grown layers, it is required in the fabrication of a thin film of such oxidic high temperature superconductors, to provide an optimum and temporally stable deposition process during the film deposition to the greatest possible extent.

One possible thin film fabrication method for such materials resides is the process of cathode sputtering. With corresponding technological cost, one can maintain most of the deposition parameters such as, for example, substrate temperature, target temperature, sputtering power, sputtering current, and process gas pressure constant.

The hitherto known cathode sputtering processes have been found, however, to be disadvantageous in that the deposited films of the oxidic high temperature superconductors do not grow perfectly monocrystalline, but rather have inhomogeneities in the film structure.

OBJECTS AND SUMMARY OF THE INVENTION

It is therefore an object of the present invention to provide a process of the aforedescribed kind that reduces the mentioned drawbacks and as a result yields a thin film, especially of an oxidic high temperature superconductor, with reduced inhomogeneities. It is further an object of the invention to provide an apparatus for producing such thin layers.

The objects of the invention are attained in a process in which the process gas is so fed into the chamber up to the plasma surrounding the target during the cathode deposition. In a region of the space around the target surface and in a cross section parallel to the target surface in the plasma, there is spectroscopically detectable, in situ, at least one emission line profile for the duration of the cathode sputtering. After setting a desired cross-sectional profile with the sputtering process startup, this cross-sectional profile is held constant over time by controlling the process gas mixing proportions.

At this point, it is worth mentioning that changes in the plasma with time can give rise to a movement therefrom such that potential changes in the vicinity of the plasma give rise to changes in the electric field and thus to changes in the plasma. The fluctuations with time of the plasma characteristics, can, by means of potential changes, for example charge transfer, effect transfer of ions out of the plasma onto the surfaces.

The changes with time in the plasma can, on the other hand, be effected by the presence of oxygen in the deposition of high temperature superconductors. The oxygen is incorporated in the layer constituted of the oxidic high temperature superconductive material (e.g. $YBa_2Cu_3O_7$) and is therefore provided also in the process gas. The oxygen can therefore be liberated at the surfaces, especially also the target surface, or captured therein. As a consequence, oxygen in the deposition process is withdrawn or supplied. It has been found that, most of all, the oxygen content of the target surface plays a significant role in the changes with time of the plasma. Depending upon the oxygen content, various high temperature superconductors (HTSC) can have metallic or insulating properties.

It has been found that the change in time of the plasma is a combination of two different components. One of these components is a periodic fluctuation of such target plasma in a range of several minutes. As a consequence, a selected emission line of one component of the plasma is detected emission spectroscopically and displayed in terms of the profile. The other component is a short-term fluctuation of the target plasma in the range of fluctuations of a second to several seconds. These fluctuations are manifested, for example, in the measured integrated intensity of the cross-sectional profile of the plasma detected emission spectroscopically.

According to the process of the invention, during the cathodic deposition, the cross sectional profile is emission spectroscopically detected and a desired cross-sectional profile is adjusted. In the process with time, this cross sectional profile is held constant by regulating the process gas mixing proportions. Advantageously with the aid of the process of the invention, because of the constancy of the cross-sectional profile, even the short-term fluctuations in the integral intensity of the emission signal are sharply reduced. As a consequence, the process of the invention results in a controlled deposition of the HTSC material on the substrate and thus an improved quality of the thin films produced with the aid of the cathode sputtering.

The process of the invention advantageously encompasses both an optimization of as well as an improved control of the deposition process. To optimize the process gas mixing proportion, the process gas is supplied and applied to the plasma, preferably in the region of the target surface. A further possibility in optimization of the deposition process is effected by setting the position of the substrate and/or by an adjustment of the substrate position in dependence upon the emission spectroscopically observed fluctuations in the line intensity. Thus the process of the invention is not limited only to the coating of small substrates but is also applicable in an advantageous manner to large area coating. Furthermore, appropriate profile orifices diaphragms can be aimed at in the target plasma.

To improve HTSC layer formation with the aid of cathode sputtering, the process of the invention enables a process stabilization by holding constant the observed profile of the emission signal. This can be effected by additional and/or reduced supply of the process gas.

In the case of the production of thin films from oxidic high temperature superconductive materials with the aid of reactive cathode sputtering, using an oxygen/argon gas mixture, it is possible in the sense of the process of the invention to monitor the emission line at 845 nm of the atomic oxygen and to effect control utilizing the resulting signal. However, other emission lines of oxygen can be selected. Furthermore, it is also possible to select one or more emission lines of the inert gas component (argon) in the gas mixture. Finally, an emission line from another of the components provided in the target plasma can be selected.

A uniform deposition can be effected with the aid of an advantageous variant wherein, by adjusting the cross-sectional profile in a surface running parallel to the target surface— perpendicular to the symmetry axis of the target in the case of symmetrical targets—a symmetrical profile can be established in the plasma, possibly with a uniform value of the intensity over the entire cross-section.

Further desirable or advantageous variations of the process of the invention are described below.

In a preferred feature, as the process gas, a gas mixture is selected combined from at least one inert gas and at least one reactive gas from the main groups VI or VII of the periodic table, especially molecular nitrogen, oxygen or fluorine. Preferably such a process gas includes a mixture of argon as the inert gas and oxygen as the reactive gas. Preferably the relative content of the reactive gas in the gas mixture is selected in the range of 5 to 80%

A preferred material for the target in the present process is an oxidic high temperature superconductor.

In order to improve the cathodic sputtering, as a special feature, a shutter system, provided as a bias electrode, and held at a desired potential, is so arranged in the region of the plasma surrounding the target that by a constriction of the plasma associated therewith an increased stability of the spectroscopically detected cross sectional profile is achieved.

An alternative process for controllably producing thin films by reactive cathodic sputtering is disclosed which comprises the steps of:

(a) feeding a process gas as a gas mixture into a process chamber having a gas inlet and a gas outlet to reach plasma surrounding a target formed as a cathode;

(b) sputtering material from the target to form plasma which is then deposited on a substrate while holding the pressure of the process gas constant;

(c) disposing at least one voltage probe in the plasma so that charged atoms in the process gas are detected; and (d) regulating the voltage value of the probe to be constant by regulation of the process gas mixing ratio in order to achieve a desired homogeneity of deposition of the target material on the substrate.

It has been found especially in the deposition of high temperature superconductive materials on suitable substrates and thus especially in the case of a large area deposition, that the oxygen concentration in the target of $YBa_2Cu_3O_x$ with $6<x<7$ can vary strongly at the target surface. This appears to be the basis for the inhomogeneous and unstable combustion of the plasma which arises. Thus changes in the gas stream and the local heating of the target play a significant role. It has been found that the fluctuations in the oxygen content by the increase or reduction of the oxygen proportion in the process gas mixture can reduce these fluctuations so that the plasma burns homogeneously. To reach this result, it is known that the oxygen must be detected. Thus at least one probe, advantageously a Langmuir probe or a Faraday cage to detect the charge in the plasma, is so applied that it does not disrupt the plasma (externally of the visible plasma cloud) and which responds to the oxygen proportion in a region in which the latter dominates, for example, adjacent the substrate. In this case, the voltage pick-up by the probe is a measure of the oxygen proportion present during cathode sputtering.

It has been found that changes in the voltage directly indicate changes in the oxygen content and by increasing or reducing the oxygen proportion fed in the process gas mixing ratio, countercontrol can be effected. In this manner, results are obtained which achieve a very simple and extremely stable adjustment of the operating point for the deposition.

In a preferred feature, as the process gas, a gas mixture is selected from a combination of at least one inert gas and at least one reactive gas from the main groups VI or VII of the periodic table, especially molecular nitrogen, oxygen or fluorine. Preferably such a process gas includes a mixture of argon as the inert gas and oxygen as the reactive gas. Preferably the relative content of the reactive gas in the gas mixture is selected in the range of 5 to 80%.

A preferred material for the target in the present process is an oxidic high temperature superconductor.

In order to improve the cathodic sputtering, as a special feature, a shutter system, provided as bias electrode, and held at a desired potential, is so arranged in the region of the plasma surrounding the target that by a constriction of the plasma associated therewith an increased stability of the voltage probe detected cross sectional profile is achieved.

Preferred voltage probes include a Langmuir probe or a Faraday cage or a combination of the two. Other voltage probes include a bias providing diaphragm system and/or a substrate holder and/or a target holder.

It has been found that the proportion of oxygen in the plasma during the deposition of high temperature superconductors change with time. The oxygen is incorporated in the layer comprised of the oxidic high temperature superconductive material (e.g. $YBa_2Cu_3O_7$) and is therefore also provided in the process gas. The oxygen can be stored in or liberated from the surfaces, especially also the target surfaces. As a result, the oxygen is withdrawn or supplied in the deposition process. It has been found that, above all, the oxygen content of the target surface plays a substantial role in the changes with time of the plasma. Depending upon the oxygen content, various high temperature superconductors (HTSC) show metallic to insulating characteristics.

The process of the invention is not limited to the production of thin layers of high temperature superconductive material. Rather the process of the invention is generally useful whenever thin layers are produced with the aid of reactive cathode sputtering.

An alternative apparatus is disclosed for producing thin films deposited on a substrate which comprises:

(a) a chamber suitable for reactive cathodic sputtering having a gas inlet and a gas outlet for control of a process gas provided as a gas mixture;

(b) at least one target provided as a cathode within said chamber;

(c) a means for mounting a substrate;

(d) a gas feeding means which introduces the process gas into the chamber from the gas inlet until it reaches the plasma volume surrounding the target during the cathodic sputtering;

(e) at least one probe as a detector of charged atoms of the process gas, said probe arranged in the vicinity of the plasma; and (f) a control system is provided which, in dependence upon the desired homogeneity of the film deposited on the substrate, which maintains a voltage value of the probe at a constant value by regulation of the process gas mixing ratio.

As a bias electrode, a shutter system adapted to be held at an appropriate electrical potential is provided to constrict the target plasma.

In consequence, the practice of the invention provides a controlled deposition of the HTSC material upon the substrate and therewith an improvement of the quality of such thin films as are produced with the aid of cathode sputtering.

The process of the invention thus advantageously includes both an optimization and also an improved control of the deposition process. For optimization of the process gas mixing ratio, the process gas is directed to the plasma, preferably in the vicinity of the target surface. A further possibility for optimization of the deposition process can reside in that the position of the substrate and/or the adjustment of the substrate position can be influenced in dependence upon the voltage value of the probe or probes. This can result from additional and/or reduced supply of the process gases.

An apparatus for producing thin films deposited on a substrate is disclosed which comprises:

(a) a chamber suitable for reactive cathodic sputtering with a gas inlet and a gas outlet for the purposes of control of a process gas provided as a gas mixture;

(b) at least one target provided as a cathode within said chamber;

(c) means for mounting a substrate;

(d) a gas feeding means is provided which introduces the process gas into the chamber from the gas inlet until it reaches the plasma volume surrounding the target during the cathodic sputtering;

(e) a measuring device for in situ spectroscopic measurement of the intensity of the cross sectional profile of one or more emission lines of one or more components provided in the plasma, and which is so arranged that said measuring device detects in a cross sectional area of a spatial region of the plasma parallel to the target surface; and (f) a control unit for controlling the process gas mixing ratio that is responsive to changes in the intensity of the cross sectional profile of said emission lines.

For the optimization and/or control of a detected cross sectional profile a control unit is provided which is dependent upon the measurement signals of the spectroscope measuring device to enable the setting of a desired cross sectional profile and a subsequent regulation of the process gas mixing ratio such that the cross sectional profile can be held constant with time.

In a preferred feature, as a bias electrode, a shutter system adapted to be held at an appropriate electrical potential is provided to constrict the target plasma.

As the inert gas in the gas mixture for the process gases, argon or xenon are, for example, suitable. The reactive gases can be, for example, nitrogen, oxygen, fluorine or one of the other reactive gases of the main groups VI or VII of the Periodic System.

BRIEF DESCRIPTION OF THE DRAWING

In the following Figures, the results achieved with the process of the invention and the apparatus of the invention are depicted.

DESCRIPTION OF THE INVENTION

In the following FIGS. 1 to 5, the results are shown for the manufacture of a thin film of high temperature superconductive $YBa_2Cu_3O_7$ by means of reactive cathode sputtering. At a process gas pressure in the sputtering chamber of 350 mTorr, a gas flow of a mixture of 40 standard ccm ($cm^3$ STP) argon and 20 standard ccm ($cm^3$ STP) oxygen is selected.

Figure 1:
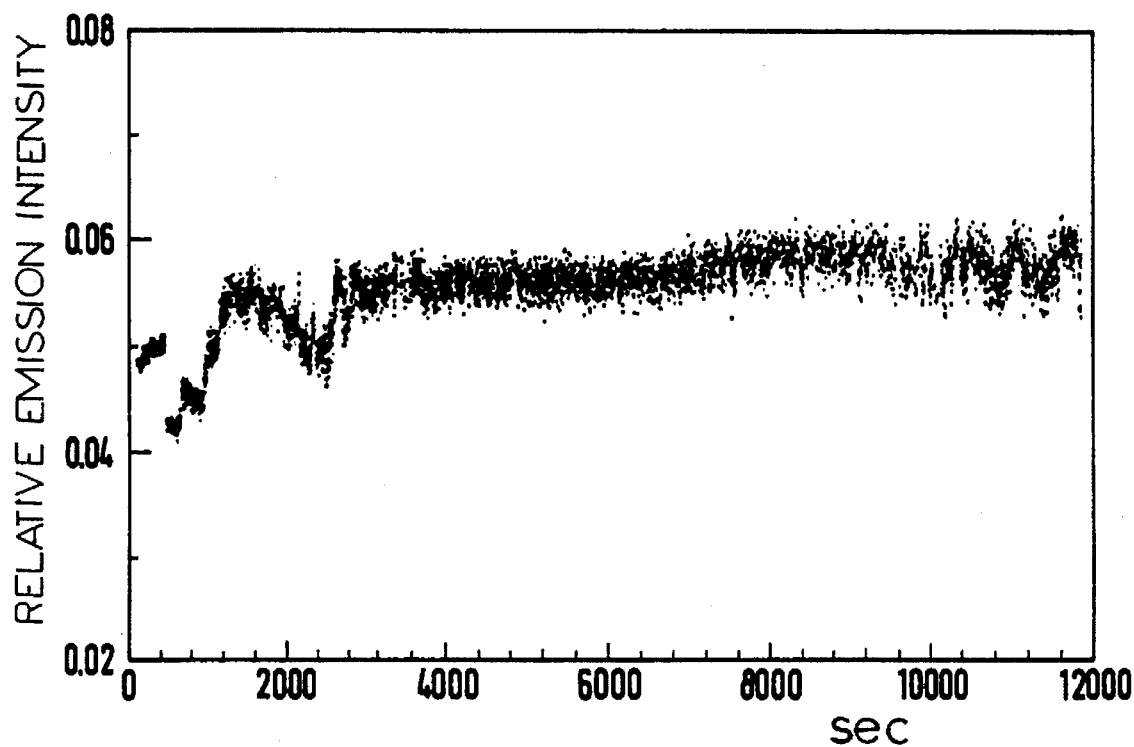
FIG. 1 shows the relative, integral measured intensity over the entire cross section profile of the emission line at 845 nm of atomic oxygen as a function of time without control of the profile of this emission line by means of the process gas mixing ratio.
Figure 2:
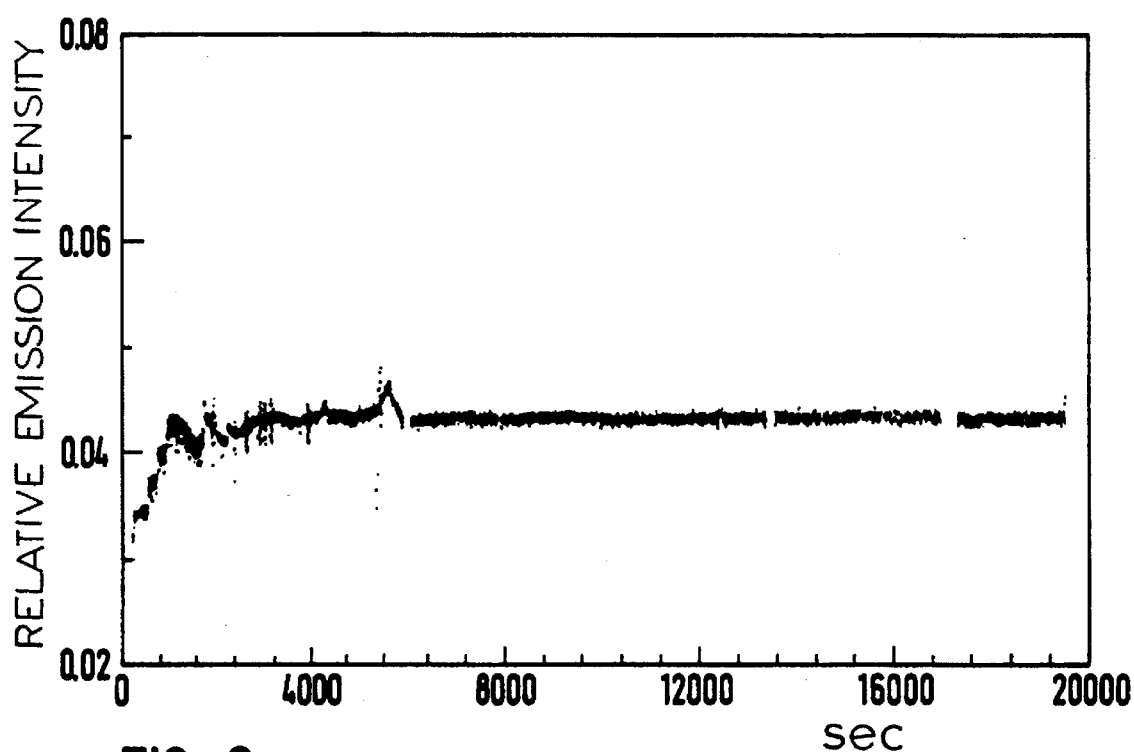
FIG. 2 shows the relative, integral measured intensity over the entire cross-sectional profile of the emission line at 845 nm of atomic oxygen as a function of time with control of the profile of this emission line by means of the process gas mixing ratio.

FIGS. 1 and 2 show as a function of time the relative intensity of the observed oxygen line at 845 nm, integrated over the total cross sectional profile, as a function of time.

One can see in both Figures the so-called sputtering initiation process in the region of the first 1000–2000 s.

FIG. 1 shows results for the case in which there is no control of the profile of this emission line by means of the process gas mixing ratio. From about 3000 s, a fluctuation in the intensity is observed. In one case, one can see long term fluctuations, for example in the time range of about 10000–12000 s which lie in the vicinity of minutes. Short time fluctuations in the range of seconds or less account for the width shown for the curve, for example in the region between 4000 and 6000 s. Control of the profile of the selected emission line by means of the process gas mixing ratio gives rise to, as shown in FIG. 2, the result that after the incipient (i.e. start up) sputtering process, an astonishing reduction occurs in the fluctuations of the relative intensity. FIG. 2 shows, for example, above 800 s, a drastic reduction both in the long term fluctuations in the relative intensity observable in the Figure, as well as of the short term fluctuations in the relative intensity. As a consequence, there is a significantly better thin film production with the control by comparison to the case without control.

Figure 3:
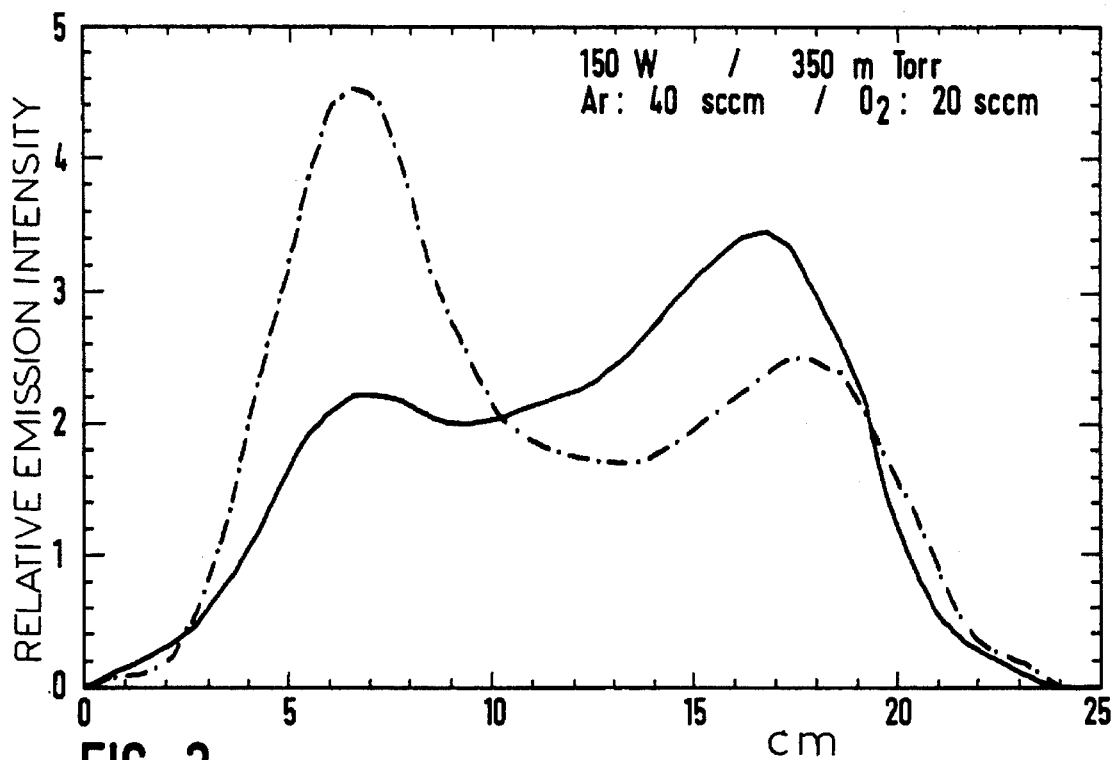
FIG. 3 shows a locally resolved cross sectional profile at two different times during the cathode sputtering without stabilizing control of the profile of the selected emission line by means of the process gas mixing ratio.
Figure 4:
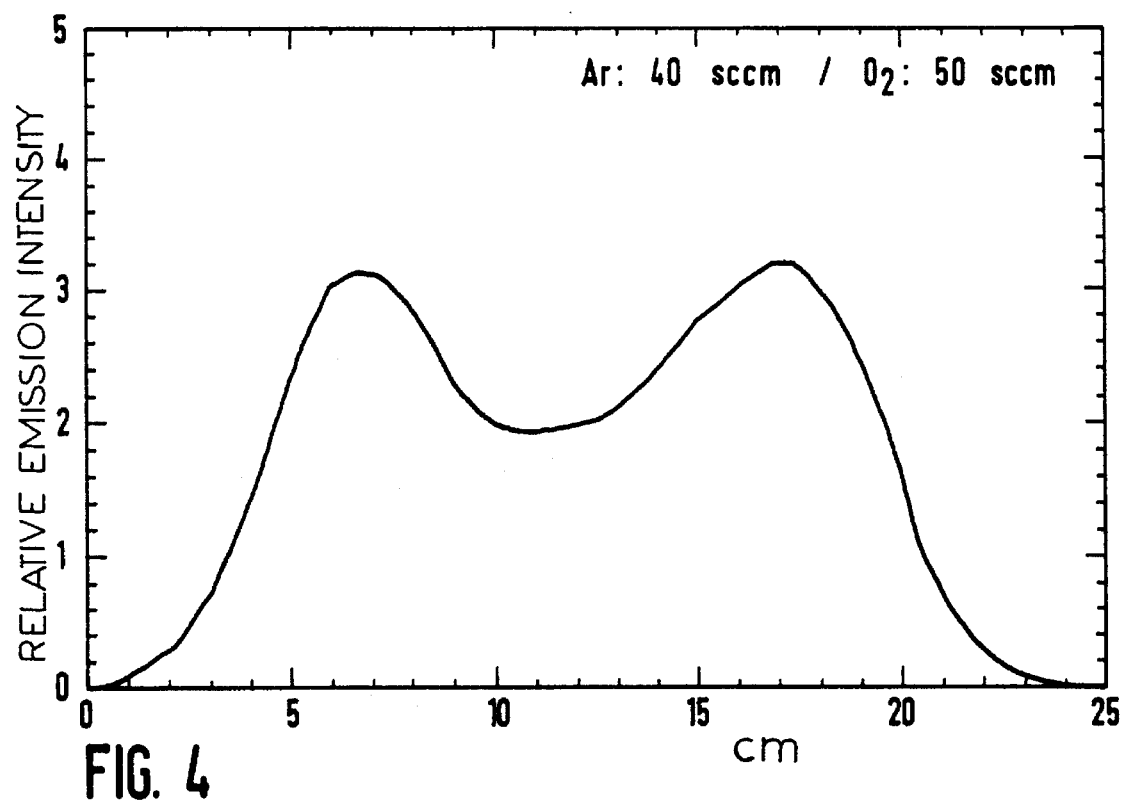
FIG. 4 shows a locally resolved cross-sectional profile at two different times during the cathode sputtering with control of the profile of the selected emission line by means of the process gas mixing ratio.

FIGS. 3 and 4 illustrate the results obtained with both above-mentioned experiments with respect to the locally resolved cross-sectional profile.

Under the same experimental conditions as given above, the desired cross-sectional profile changes during the measurement as shown. In the case of no control, two profiles have been illustrated in FIG. 3 for different times. The drastic fluctuations in the form of the profile results in a timewise inhomogeneous deposition of the HTSC material on the substrate. In the case of control, the form of the cross section profile can be held constant. As a result of this feature, also the short term fluctuations in the plasma are sharply reduced in an advantageous way. As a result, thin films are deposited with improved characteristics.

Figure 5:
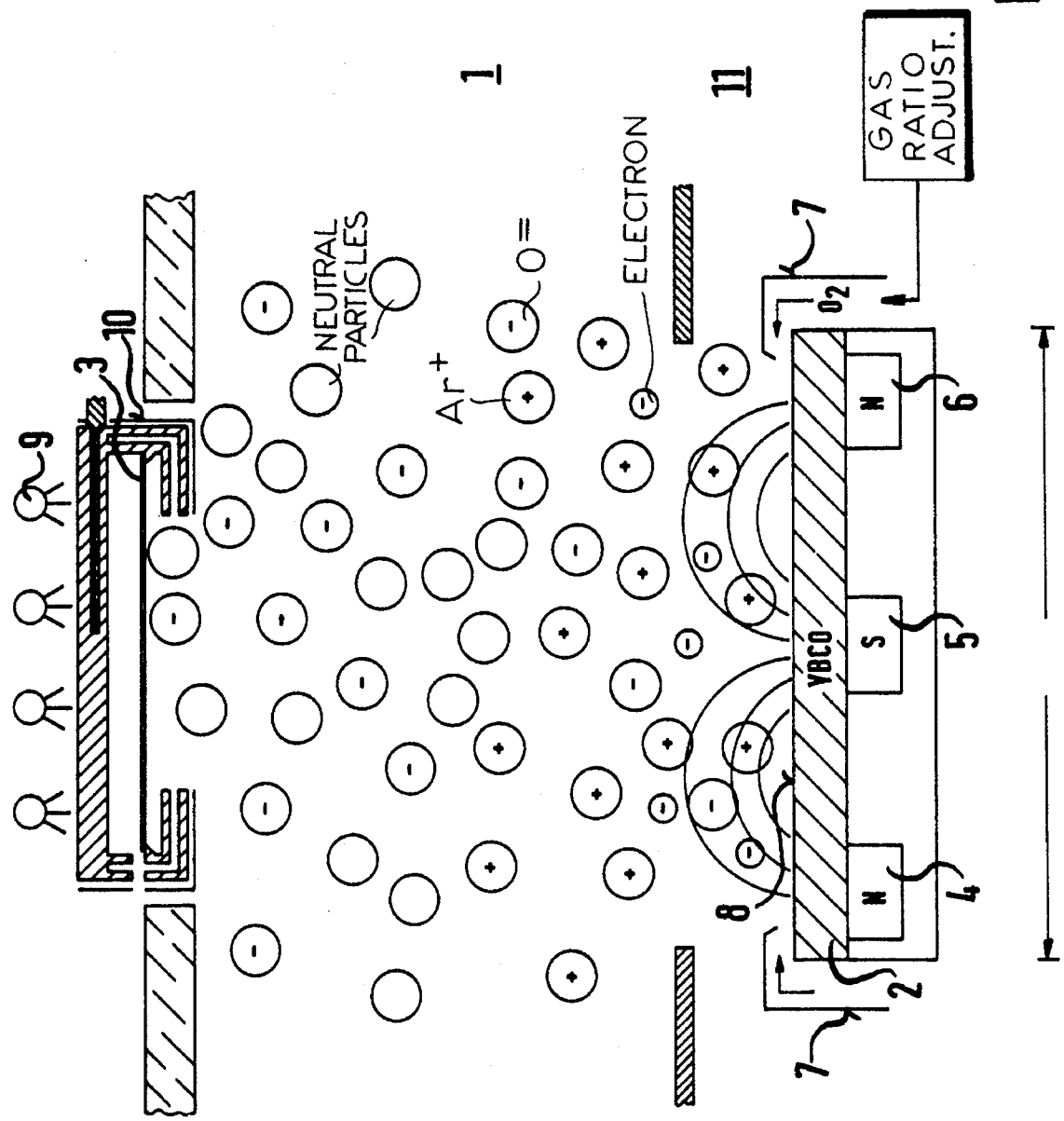
FIG. 5 is an illustration of the region of the plasma between the target and the substrate.

In FIG. 5, the region around the plasma 1 between the target 2 and the substrate 3 has been illustrated schematically. The high temperature superconductive oxide $YBa_2Cu_3O_x$ is chosen as the target material. Furthermore, with the aid of a magnet system 4, 5, 6, a magnetron type magnetic field is generated on the target surface. With the help of the shield 7, oxygen ($O_2$) is directed to the target surface 8.

During the cathode sputtering, there is formed in the region between target and substrate, because of the choice of the argon/oxygen process gas mixture, the plasma 1 which contains negatively charged oxygen atoms, electrons, positively charged argon atoms, and neutral particles (e.g. Y, Ba, Cu, oxide, Ar).

The negatively charged particles, especially the negatively charged oxygen atoms, are accelerated in the direction of the substrate 3 held by the substrate holder formed as an anode 10. The substrate is held at a defined elevated temperature by the radiant heaters 9.

To constrict the plasma 1, a shutter 11 is further provided. The substrate holder 10 serves in this case as a Langmuir probe.

At a substrate diameter of 4 inches and a target diameter of 12 inches, upon application of a voltage of about 200 volts between the cathode and anode, a current flow of about 1 A is formed. Thus a voltage of about −16 volts is observed at the substrate holder 10 formed as a Langmuir probe. The fluctuations in the plasma result in a change of the voltage value at the probe of up to several volts. These fluctuations are eliminated by control of the process gas mixture to less than 0.1 volt.

With the control device, 100 to 300 nm thick $YBa_2Cu_3O_x$ layers are produced on an MgO substrate. Alternatively, $SrTiO_3$ can also be selected as the substrate material. These layers are characterized by a homogeneity of the electrical resistance, measured over the substrate surface, with variations less than 2.5% of the mean resistance value, which signifies an extreme value for high temperature superconductors.

By comparison, the value in the case of such a layer manufactured without control by means of the Langmuir probe, is 25% of the mean resistance.

We claim:

1. A process for controllably producing a thin film by reactive cathodic sputtering which comprises the steps of:
   (a) feeding a process gas as a gas mixture into a process chamber having a gas inlet and a gas outlet to reach plasma surrounding a target formed as a cathode;
   (b) sputtering material from the target to form plasma which is then deposited on a substrate while holding the pressure of the process gas constant;
   (c) spectroscopically detecting in situ one or more emission lines of at least one component provided in the plasma in a spatial region of a cross sectional area of the plasma running parallel to the target surface, according to its profile; and
   (d) after setting a desired cross sectional profile, regulating the process gas mixing ratio to hold the cross sectional profile constant.

2. Process according to claim 1 characterized in that a symmetrical cross-sectional profile is set.

3. Process according to claim 1 characterized in that, as the process gas, a gas mixture is prepared from a combination of at least one inert gas and at least one reactive gas from the main groups VI and VII.

4. Process according to claim 1 characterized in that the process gas is a mixture of argon and oxygen.

5. Process according to claim 1 characterized in that the relative content of the reactive gas in the gas mixture is selected in the range of 5 to 80%.

6. Process according to claim 1 characterized in that as the material for the target, an oxidic high temperature superconductor is selected.

7. Process according to claim 1 characterized in that a shutter system, provided as a bias electrode held at an appropriate potential is so arranged in the region of the plasma surrounding the target during the cathodic sputtering that by a constriction of the plasma associated therewith an increased stability of the spectroscopically detected cross-sectional profile is achieved.

8. A process for controllably producing a thin film by reactive cathodic sputtering which comprises the steps of:
   (a) feeding a process gas as a gas mixture into a process chamber having a gas inlet and a gas outlet to reach plasma surrounding a target formed as a cathode;
   (b) sputtering material from the target to form plasma which is then deposited on a substrate while holding the pressure of the process gas constant;
   (c) disposing at least one voltage probe in the plasma so that charged atoms in the process gas are detected; and
   (d) regulating the voltage value of the probe to be constant by regulation of the process gas mixing ratio in order to achieve a desired homogeneity of deposition of the target material on the substrate.

9. Process according to claim 8 characterized that said at least one probe is arranged in the vicinity of the plasma.

10. Process according to claim 8, characterized in that as the process gas, a gas mixture is selected from a combination of at least one inert gas and at least one reactive gas from the main groups VI add VII of the Periodic Table.

11. Process according to claim 8 characterized in that the process gas is a mixture of argon and oxygen.

12. Process according to claim 8, characterized in that the relative content of the reactive gas in the gas mixture is selected in the range of 5 to 80%.

13. Process according to claim 8, characterized in that as the material for the target, an oxidic high temperature superconductor is selected.

14. Process according to claim 8, characterized in that a shutter system, provided as a bias electrode held at an appropriate potential is so arranged in the region of the plasma surrounding the target during the cathodic sputtering that by a constriction of the plasma associated therewith an increased stability of the voltage probe is achieved.

15. Process according to claim 8, characterized in that a Langmuir probe or a Faraday cage or a combination of the two is provided as said voltage probe.

16. Process according to claim 8, characterized in that as the voltage probe, a diaphragm system and/or substrate holder and/or target holder is provided.

17. An apparatus for producing thin films deposited on a substrate which comprises:
   (a) a chamber for reactive cathodic sputtering having a gas inlet and a gas outlet for control of a process gas provided as a gas mixture;
   (b) at least one target provided as a cathode within said chamber;
   (c) a means for mounting a substrate;
   (d) a gas feeding means which introduces the process gas into the chamber from the gas inlet until it reaches the plasma volume surrounding the target during the cathodic sputtering;

(e) a measuring device for in situ spectroscopic measurement of the intensity of the cross sectional profile of one or more emission lines of one or more components provided in the plasma, and which is so arranged that said measuring device detects in a cross sectional area of a spatial region of the plasma parallel to the target surface; and (f) means for controlling the process gas mixing ratio that is responsive to changes in the intensity of the cross sectional profile of said emission lines.

18. Apparatus according to claim 17, characterized in that for the optimization and/or control of a detected cross sectional profile a control unit is provided which in dependence upon the measurement signals from the spectroscope measuring device enables the setting of a desired cross sectional profile and a subsequent regulation of the process gas mixing ratio such that the cross-sectional profile can be held constant with time.

19. Apparatus according to claim 17 characterized in that as the process gas, a gas mixture is selected from a combination of at least one inert gas and at least one reactive gas from the main groups VI or VII of the Periodic Table.

20. Apparatus according to claim 17 characterized in that the process gas is a mixture of argon and oxygen.

21. Apparatus according to claim 17 characterized in that as the target material an oxidic high temperature superconductor is provided.

22. Apparatus according to claim 17 characterized in that as a bias electrode, a shutter system adapted to be held at an appropriate electrical potential is provided to constrict the target plasma.

23. An apparatus for producing thin films deposited on a substrate which comprises:

(a) a chamber for reactive cathodic sputtering having a gas inlet and a gas outlet for control of a process gas provided as a gas mixture;

(b) at least one target provided as a cathode within said chamber;

(c) a means for mounting a substrate;

(d) a gas feeding means for introducing the process gas into the chamber from the gas inlet until it reaches the plasma volume surrounding the target during the cathodic sputtering;

(e) at least one voltage probe as a detector of charged atoms of the process gas, said probe arranged in the vicinity of the plasma; and (f) a control system which in dependence upon the desired homogeneity of the film deposited on the substrate, maintains the voltage value of the probe at a constant value by regulation of the process gas mixing ratio.

24. Apparatus according to claim 23 characterized in that as the process gas, a gas mixture is selected from a combination of at least one inert gas and at least one reactive gas from the main groups VI or VII of the Periodic Table.

25. Apparatus according to claim 23 characterized in that the process gas is a mixture of argon and oxygen.

26. Apparatus according to claim 23 characterized in that as the target material an oxidic high temperature superconductor is provided.

27. Apparatus according to claim 23 characterized in that as a bias electrode, a shutter system adapted to be held at an appropriate electrical potential is provided to constrict the target plasma.

28. Apparatus according to claim 23 characterized in that as the probe a Langmuir probe or a Faraday cage is provided.

29. Apparatus according to claim 23 wherein as the probe, a diaphragm system and/or the substrate holder and/or a target holder is provided.

* * * * *